United States Patent
Ye et al.

(10) Patent No.: US 8,907,332 B2
(45) Date of Patent: Dec. 9, 2014

(54) ORGANIC LIGHT EMITTING DISPLAY DEVICE

(71) Applicant: Samsung Display Co., Ltd., Yongin, Gyeonggi-Do (KR)

(72) Inventors: Ji-Myoung Ye, Yongin (KR); Ha-Jin Song, Yongin (KR); Byeong-Wook Yoo, Yongin (KR); Bum-Suk Lee, Yongin (KR); Ji-Young Kwon, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 0 days.

(21) Appl. No.: 13/938,561

(22) Filed: Jul. 10, 2013

(65) Prior Publication Data

US 2014/0231760 A1  Aug. 21, 2014

(30) Foreign Application Priority Data

Feb. 18, 2013 (KR) .......................... 10-2013-0016911

(51) Int. Cl.
  *H01L 51/00* (2006.01)
  *H01L 51/50* (2006.01)

(52) U.S. Cl.
  CPC .................................. *H01L 51/5016* (2013.01)
  USPC ..................................... 257/40; 257/E51.022

(58) Field of Classification Search
  USPC .......................... 257/40, 88, E51.022; 438/99
  See application file for complete search history.

(56) References Cited

U.S. PATENT DOCUMENTS

| 7,723,735 B2* | 5/2010 | Matsuda .......................... 257/88 |
| 7,948,165 B2* | 5/2011 | Spindler et al. ................ 313/504 |
| 2007/0075310 A1 | 4/2007 | Lee |
| 2010/0156283 A1 | 6/2010 | Kang et al. |
| 2012/0314033 A1 | 12/2012 | Lee et al. |

FOREIGN PATENT DOCUMENTS

| KR | 10-2007-0036994 | 4/2007 |
| KR | 10-2009-0072588 | 7/2009 |
| KR | 10-2009-0082200 | 7/2009 |
| KR | 10-2010-0031059 | 3/2010 |
| KR | 10-2011-0097647 | 8/2011 |

* cited by examiner

*Primary Examiner* — Quoc Hoang
(74) *Attorney, Agent, or Firm* — Robert E. Bushnell, Esq.

(57) ABSTRACT

An organic light emitting display device includes a substrate including first, second and third sub-pixel regions, a first electrode formed in each of the first sub-pixel region, the second sub-pixel region, and the third sub-pixel region of the substrate, a first light emitting layer formed on the first electrode of each of the first sub-pixel region, the second sub-pixel region, and the third sub-pixel region, spacer layers formed on the first light emitting layer of the first sub-pixel region and the second sub-pixel region and including a material of the first light emitting layer, a second light emitting layer formed on the spacer layer of the first sub-pixel region, a third light emitting layer formed on the spacer layer of the second sub-pixel region, and a second electrode formed on the first light emitting layer, the second light emitting layer, and the third light emitting layer.

9 Claims, 1 Drawing Sheet

ORGANIC LIGHT EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 18 Feb. 2013 and there duly assigned Serial No. 10-2013-0016911.

BACKGROUND OF THE INVENTION

1. Field of the Invention

An embodiment of the present invention relates to an organic light emitting display device, and more particularly, to an organic light emitting display device capable of reducing a driving voltage and improving emission efficiency.

2. Description of the Related Art

An organic light emitting display device may be formed by a passive matrix method in which organic light emitting diodes (OLED) are coupled between scan lines and data lines in a matrix to form pixels and an active matrix method in which operations of pixels are controlled by thin film transistors (TFT) that function as switches. In general, the organic light emitting display device of the active matrix method includes TFTs for transmitting signals and capacitors for maintaining signals.

The OLED includes an anode electrode, a light emitting layer, and a cathode electrode. When a voltage is applied between the anode electrode and the cathode electrode, holes injected into the anode electrode and electrons injected into the cathode electrode are re-combined with each other in the light emitting layer to generate exitons and the generated exitons are transited to a base state to emit light. At this time, the emitted light may have different wavelengths, for example, red, green, and blue wavelengths in accordance with the light emitting layer. The wavelength of the emitted light may be determined by a material (an organic matter including a host material and a dopant material) of the light emitting layer.

Since OLEDs emit light by re-combination of the holes and the electrons, mobilities of the holes and the electrons are very important. For this purpose, the light emitting layer includes an injecting layer and a transport layer that facilitate movements of the holes and the electrons. It is however necessary to develop a technology of improving emission efficiency.

The above information disclosed in this Background section is only for enhancement of understanding of the background of the described technology and therefore it may contain information that does not form the prior art that is already known in this country to a person of ordinary skill in the art.

SUMMARY OF THE INVENTION

Accordingly, the present invention has been made to provide an organic light emitting display device capable of improving emission efficiency.

The present invention has been also made to provide an organic light emitting display device capable of reducing a driving voltage.

In order to achieve the foregoing and/or other aspects of the present invention, there is provided an organic light emitting display device, including a substrate including a first sub-pixel region, a second sub-pixel region, and a third sub-pixel region, a first electrode formed in each of the first sub-pixel region, the second sub-pixel region, and the third sub-pixel region of the substrate, a first light emitting layer formed on the first electrode of each of the first sub-pixel region, the second sub-pixel region, and the third sub-pixel region, spacer layers formed on the first light emitting layer of the first sub-pixel region and the second sub-pixel region and including a material of the first light emitting layer, a second light emitting layer formed on the spacer layer of the first sub-pixel region, a third light emitting layer formed on the spacer layer of the second sub-pixel region, and a second electrode formed on the first light emitting layer, the second light emitting layer, and the third light emitting layer.

The first light emitting layer may include a host material and a dopant material and density of the dopant material may be 1.0% to 5.0%.

The spacer layers may include the host material of the first light emitting layer. The host material may be a carbazol based material. The spacer layers may be formed to a thickness of 3 nm to 10 nm.

The organic light emitting display device may further include a first auxiliary layer formed between the second light emitting layer and the second electrode and a second auxiliary layer formed between the third light emitting layer and the second electrode.

In accordance with the embodiment of the present invention, the spacer layers including the host material of the first light emitting layer are arranged on each of the interfaces of the first light emitting layer, the second light emitting layer, and the third light emitting layer. The spacer layers have the holes easily transmitted from the first light emitting layer to the second light emitting layer and the third light emitting layer so that the driving voltage may be reduced and have the triple excitons generated by the host material of the first light emitting layer contribute to emission in the second light emitting layer and the third light emitting layer so that emission efficiency may be improved.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
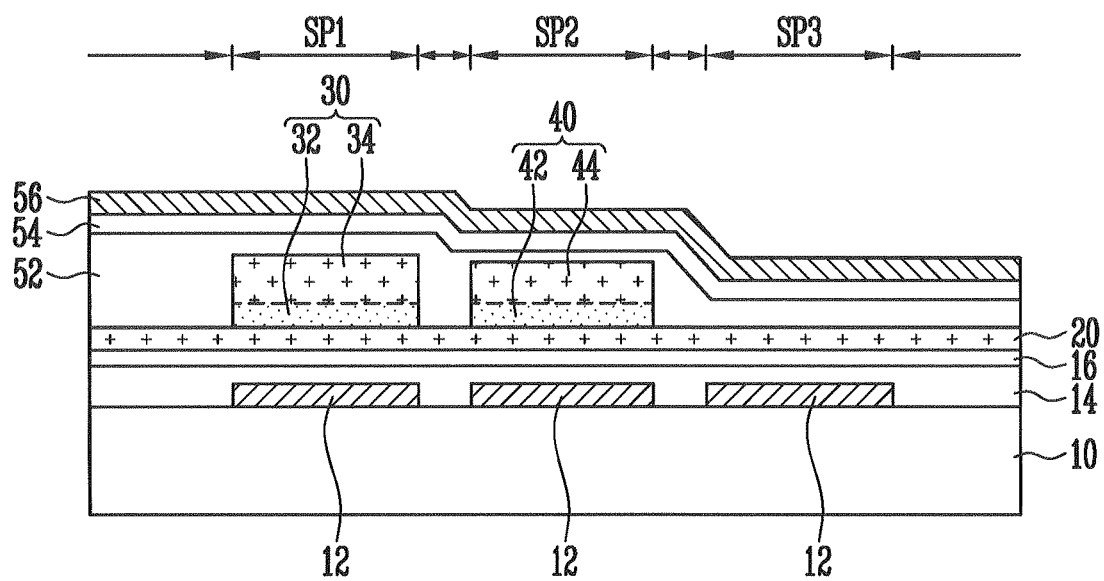
FIG. 1 is a sectional view illustrating an organic light emitting display device according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween. Hereinafter, like reference numerals refer to like elements.

Hereinafter, the present invention will be described more fully with reference to the accompanying drawings, in which embodiments of the invention are shown. This invention may, however, be embodied in many different forms and should not be construed as being limited to the embodiments set forth herein; rather these embodiments are provided so that this disclosure will be thorough and complete, and will fully convey the concept of the present invention to those skilled in the art.

FIG. 1 is a sectional view illustrating an organic light emitting display device according to an embodiment of the present invention.

An organic light emitting display device according to the embodiment of the present invention includes a substrate including a display region in which an image is displayed and a non-display region around the display region, a plurality of pixels formed in the display region of the substrate, and an encapsulation unit for sealing up the plurality of pixels.

Each of the plurality of pixels includes a plurality of sub-pixels, for example, a red sub-pixel, a green sub-pixel, a blue sub-pixel, and a white sub-pixel. Each of the sub-pixels may be formed of an organic light emitting diode (OLED). The OLED includes an anode electrode, a cathode electrode, and a light emitting layer interposed between the anode electrode and the cathode electrode. A hole injecting layer and a hole transport layer may be interposed between the anode electrode and the light emitting layer. An electron transport layer and an electron injecting layer may be interposed between the light emitting layer and the cathode electrode.

FIG. 1 illustrates a part of a display region in which an image is displayed. Sections of a plurality of sub-pixels that form a pixel, for example, a first sub-pixel SP1, a second sub-pixel SP2, and a third sub-pixel SP3 are illustrated.

In reference to FIG. 1, a first electrode 12 as an anode electrode is formed in each of the first sub-pixel region SP1, the second sub-pixel region SP2, and the third sub-pixel region SP3 of a substrate 10 and a hole injecting layer 14 and a hole transport layer 16 are formed on the substrate 10 including the first electrode 12. The hole injecting layer 14 or the hole transport layer 16 may be omitted or formed of a plurality of layers.

A first light emitting layer 20 is formed on the hole transport layer 16. In FIG. 1, the first light emitting layer 20 is commonly formed in the first sub-pixel region SP1, the second sub-pixel region SP2, and the third sub-pixel region SP3. However, the first light emitting layer 20 may be selectively formed only in a region.

A second light emitting layer 30 is formed on the first light emitting layer 20 of the first sub-pixel region SP1 and a third light emitting layer 40 is formed on the first light emitting layer 20 of the second sub-pixel region SP2.

An electron transport layer 52 and an electron injecting layer 54 are formed on the first light emitting layer 20 including the second light emitting layer 30 and the third light emitting layer 40. A second electrode 56 as a cathode electrode is formed on the electron injecting layer 54. The electron transport layer 52 or the electron injecting layer 54 may be omitted or may be formed of a plurality of layers.

The first light emitting layer 20 includes a host material and a dopant material that may emit a predetermined wavelength, for example, blue light. The dopant material of no more than 5.0%, for example, 1.0% to 5.0% of entire density may be included.

The second light emitting layer 30 and the third light emitting layer 40 include spacer layers 32 and 42 and light emitting layers 34 and 44.

The spacer layers 32 and 42 include a material of the first light emitting layer 20. The material as the host material of the first light emitting layer 20 may be, for example, a carbazol based material. The spacer layers 32 and 42 may be formed to a thickness of no less than 3 nm, for example, 3 nm to 10 nm.

The light emitting layer 34 includes the host material and the dopant material that emit a predetermined wavelength, for example, red light. The light emitting layer 44 includes the host material and the dopant material that may emit a predetermined wavelength, for example, green light.

Figure 2:
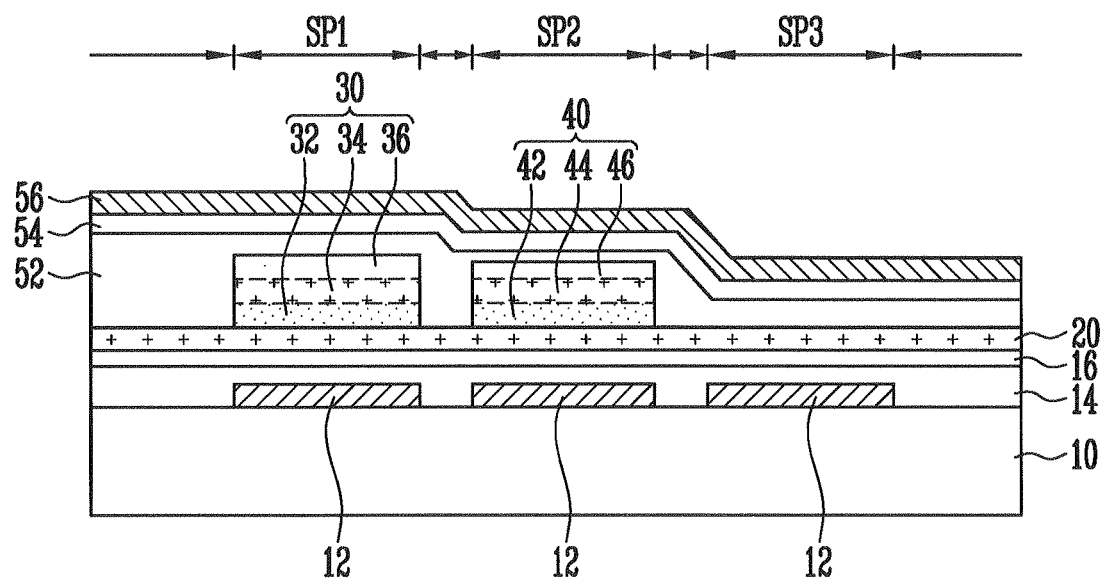
FIG. 2 is a sectional view illustrating an organic light emitting display device according to another embodiment of the present invention.

FIG. 2 is a sectional view illustrating an organic light emitting display device according to another embodiment of the present invention.

In the embodiment of FIG. 1, the second light emitting layer 30 and the third light emitting layer 40 include the spacers 32 and 42 and the light emitting layers 34 and 44. However, in accordance with the present embodiment, the second light emitting layer 30 includes the spacer layer 32, the light emitting layer 34, and a first auxiliary layer 36 and the third light emitting layer 40 includes the spacer layer 42, the light emitting layer 44, and a second auxiliary layer 46.

For convenience sake, only the first and second auxiliary layers 36 and 46 that are not described in the embodiment of FIG. 1 will be described.

The first and second auxiliary layers 36 and 46 control optical thicknesses (resonance distances) of the light emitting layers 30 and 40 to realize micro-cavity effect. When the optical thickness of the second light emitting layer 30 is larger than that of the third light emitting layer 40, the thickness of the first auxiliary layer 36 may be larger than that of the second auxiliary layer 46. When the first and second auxiliary layers 36 and 46 are formed to be thick, the first and second auxiliary layers 36 and 46 may function as buffer layers for preventing the light emitting layers 30 and 40 from being damaged.

In accordance with the embodiment of the present invention, since the first light emitting layer 20 is commonly formed in the first sub-pixel region SP1, the second sub-pixel region SP2, and the third sub-pixel region SP3, the first light emitting layer 20 may be easily manufactured and defect caused by damage in a manufacturing process may be minimized.

In the first sub-pixel region SP1 and the second sub-pixel region SP2, however, since the first light emitting layer 20, the second light emitting layer 30, and the third light emitting layer 40 overlap each other, in order to drive a first sub-pixel and a second sub-pixel, a high voltage is required. As a result, power consumption is increased. In addition, due to a complicated structure, mobilities of holes and electrons in each of the light emitting layer 30 or 40 deteriorate. In order to improve emission efficiency, mobility characteristics of the holes and the electrons in each of the light emitting layers 30 or 40 must be established. However, it is difficult to establish the mobility characteristics due to the complicated structure.

In accordance with the embodiment of the present invention, in order to reduce a driving voltage and to improve mobility of holes, the spacer layers 32 and 42 are arranged on each of interfaces of the first light emitting layer 20, the second light emitting layer 30, and the third light emitting layer 40.

The spacer layers 32 and 42 do not include a dopant material that contributes to emission but include only a host material that contributes to transmission of holes. Since the spacer layers 32 and 42 include the host material of the first light emitting layer 20, the holes that move through the first light emitting layer 20 are easily transmitted to the light emitting layers 34 and 44 so that the driving voltage may be reduced. In addition, since triple excitons generated by the host material of the first light emitting layer 20 that emits, for example, blue light contribute to emission in the light emitting layer 34 that emits, for example, red light and the light emitting layer 44 that emits, for example, green light, emission efficiencies of the first sub-pixel and the second sub-pixel may be improved.

In order to maximize effect of the embodiment of the present invention, the first light emitting layer 20 may be formed of a stable fluorescent material that has a long life as a host material, for example, a carbazol based material. In addition, when the dopant material of the first light emitting layer 20 is transmitted to the second light emitting layer 30 and the third light emitting layer 40, since the emission efficiencies of the first sub-pixel and the second sub-pixel deteriorate, the dopant material of the first light emitting layer 20 may be controlled to be no more than 5% of entire density so that Forster transfer of host singlet-to-dopant singlet is performed and Dexter transfer of host triplet-to-dopant triplet is not performed.

In addition, in the host singlet of the spacer layers 32 and 42, the spacer layers 32 and 42 may be formed to have a thickness of no less than 3 nm so that efficiency caused by S→S transfer from the host singlet of the spacer layers 32 and 42 to the host singlet of the light emitting layers 34 and 44 increases.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device, comprising:
   a substrate including a first sub-pixel region, a second sub-pixel region, and a third sub-pixel region;
   a first electrode formed in each of the first sub-pixel region, the second sub-pixel region, and the third sub-pixel region of the substrate;
   a first light emitting layer formed on the first electrode of each of the first sub-pixel region, the second sub-pixel region, and the third sub-pixel region;
   spacer layers formed on the first light emitting layer of the first sub-pixel region and the second sub-pixel region and including a material of the first light emitting layer;
   a second light emitting layer formed on the spacer layer of the first sub-pixel region;
   a third light emitting layer formed on the spacer layer of the second sub-pixel region, the third light emitting layer disposed spaced apart from the second light emitting layer; and
   a second electrode formed on the first light emitting layer, the second light emitting layer, and the third light emitting layer.

2. The organic light emitting display device as claimed in claim 1,
   wherein the first light emitting layer comprises a host material and a dopant material, and
   wherein density of the dopant material is 1.0% to 5.0%.

3. The organic light emitting display device as claimed in claim 2, wherein the spacer layers comprise the host material of the first light emitting layer.

4. The organic light emitting display device as claimed in claim 1, wherein the spacer layers comprise the host material of the first light emitting layer.

5. The organic light emitting display device as claimed in claim 4, wherein the host material is a carbazol based material.

6. The organic light emitting display device as claimed in claim 1, wherein the spacer layers are formed to a thickness of 3 nm to 10 nm.

7. The organic light emitting display device as claimed in claim 1, further comprising a hole injecting layer and a hole transport layer formed between the first electrode and the first light emitting layer.

8. The organic light emitting display device as claimed in claim 1, further comprising:
   an electron transport layer formed on the first light emitting layer, the second light emitting layer, and the third light emitting layer; and
   an electron injecting layer formed between the electron transport layer and the second electrode.

9. The organic light emitting display device as claimed in claim 1, further comprising:
   a first auxiliary layer formed between the second light emitting layer and the second electrode; and
   a second auxiliary layer formed between the third light emitting layer and the second electrode.

\* \* \* \* \*